US007779312B2

(12) United States Patent
Tseng et al.

(10) Patent No.: US 7,779,312 B2
(45) Date of Patent: Aug. 17, 2010

(54) BUILT-IN REDUNDANCY ANALYZER AND METHOD FOR REDUNDANCY ANALYSIS

(75) Inventors: Tsu-Wei Tseng, Taipei (TW); Chih-Chiang Hsu, Taipei County (TW); Jin-Fu Li, Pingtung County (TW); Chien-Yuan Pao, Taipei (TW)

(73) Assignee: Faraday Technology Corp., Science-Based Industrial Park, Hsin-Chu (TW)

( * ) Notice: Subject to any disclaimer, the term of this patent is extended or adjusted under 35 U.S.C. 154(b) by 495 days.

(21) Appl. No.: 11/837,721

(22) Filed: Aug. 13, 2007

(65) Prior Publication Data
US 2009/0049333 A1 Feb. 19, 2009

(51) Int. Cl.
*G11C 29/00* (2006.01)
(52) U.S. Cl. ..................................... 714/711
(58) Field of Classification Search ................ 714/710, 714/711, 718, 733
See application file for complete search history.

(56) References Cited

U.S. PATENT DOCUMENTS

| 5,987,632 A * | 11/1999 | Irrinki et al. ............ 714/711 |
| 6,560,740 B1 | 5/2003 | Zuraski, Jr. et al. |
| 6,574,757 B1 * | 6/2003 | Park et al. ............... 714/710 |
| 6,634,003 B1 * | 10/2003 | Phan ...................... 714/710 |
| 6,898,143 B2 | 5/2005 | Puri et al. |
| 6,973,605 B1 * | 12/2005 | Templeton et al. ....... 714/718 |
| 7,076,699 B1 * | 7/2006 | Puri et al. ............... 714/710 |
| 7,149,924 B1 * | 12/2006 | Zorian et al. ............. 714/30 |
| 7,228,468 B2 * | 6/2007 | Wu et al. ................ 714/710 |
| 7,284,166 B2 * | 10/2007 | Zappa et al. ............. 714/710 |
| 7,298,658 B2 * | 11/2007 | Anazawa et al. ......... 365/200 |
| 7,421,636 B2 * | 9/2008 | Kang et al. ............. 714/733 |
| 2006/0031726 A1 | 2/2006 | Zappa et al. |
| 2006/0161803 A1 | 7/2006 | Andreev et al. |

* cited by examiner

Primary Examiner—James C Kerveros
(74) Attorney, Agent, or Firm—Winston Hsu

(57) ABSTRACT

A built-in redundancy analyzer and a redundancy analysis method thereof for a chip having a plurality of repairable memories are provided. The method includes the following steps. First, the identification code of a repairable memory containing a fault ("fault memory" for short) is identified and a parameter is provided according to the identification code. The parameter includes the length of row address, the length of column address, the length of word, the number of redundancy rows, and the number of redundancy columns of the fault memory. Since the parameter of every individual repairable memory is different, the fault location is converted into a general format according to the parameter for easier processing. A redundancy analysis is then performed according to the parameter and the converted fault location, and the analysis result is converted from the general format to the format of the fault memory and output to the fault memory.

19 Claims, 8 Drawing Sheets

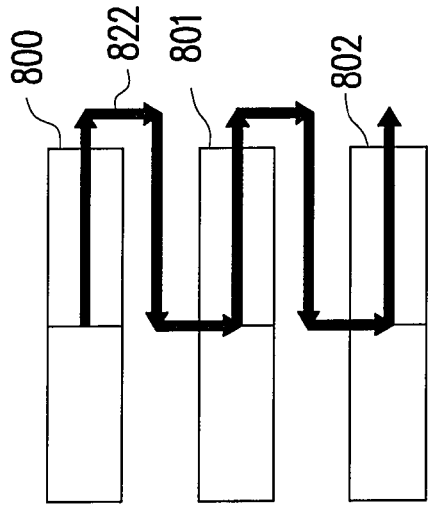
FIG. 8A
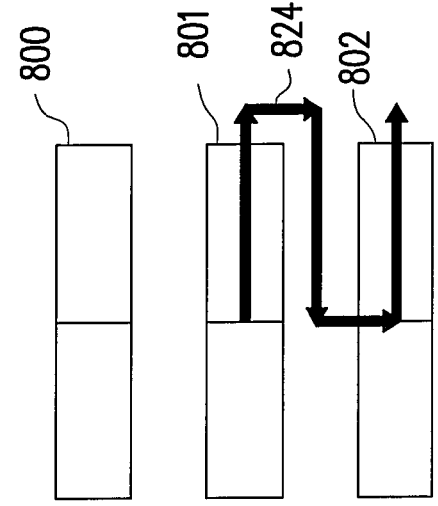
FIG. 8B
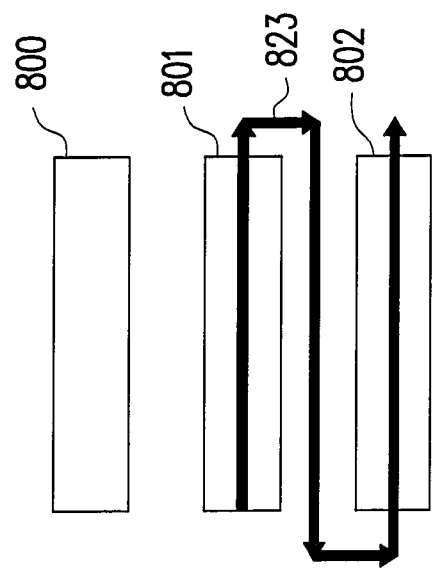
FIG. 8D
FIG. 8C

BUILT-IN REDUNDANCY ANALYZER AND METHOD FOR REDUNDANCY ANALYSIS

BACKGROUND OF THE INVENTION

1. Field of the Invention

The present invention generally relates to a built-in self repair (BISR) technique of a memory, in particular, to a built-in redundancy analyzer (BIRA) and a redundancy analysis method thereof.

2. Description of Related Art

It may be a big problem for testing a chip when the circuit on the chip includes a plurality of memories. The input and output terminals of all the memories have to be connected to outside of the chip if an external apparatus is used for testing the chip. Such a large quantity of wirings takes up a lot of chip space and increases the complexity of the circuit layout, and moreover, is not realistic when the pin number of the chip is limited. Accordingly, a concept of built-in self test (BIST) is provided. BIST is to build a testing circuit and the memories to be tested on the same chip, so that the input and output terminals of the memories do not have to be connected to outside of the chip for testing purpose. After repairable memory is invented, BIST technique has been extended to built-in self repair (BISR) technique.

FIG. 1 illustrates a conventional BISR circuit. Referring to FIG. 1, a built-in tester 102 is used for testing a repairable memory 101. If a fault occurs, the built-in tester 102 notifies the fault location to a built-in redundancy analyzer (BIRA) 103. The BIRA 103 then analyzes the fault information and issues an optimal repair method to the repairable memory 101. The repairable memory 101 repairs the column or row containing the fault by using a built-in redundancy, namely, a redundancy column and/or a redundancy row, according to this repair method.

The conventional BIRA can only analyze the fault information of a single memory and is designed based on the parameter of this memory. The aforementioned parameter includes the length of column address, the length of row address, the length of word, the number of redundancy column, and the number of redundancy row of the memory, wherein length refers to bit number. Multiple built-in redundancy analyzers are required correspondingly if the circuit on a chip includes a plurality of memories, which not only takes up a lot of chip space but also increases the cost of the chip. The circuit illustrated in FIG. 1 becomes unrealistic when the number of built-in redundancy analyzers increases along with the increase of the number of memories.

FIG. 2 illustrates another conventional BISR circuit, wherein the built-in tester 102 and the BIRA 103 illustrated in FIG. 1 are replaced by a processor 204, and the testing and repair analysis are both completed by a software in the processor 204. Since the software can adjust itself based on the parameters of different memories, the processor 204 can be used for testing and analyzing multiple repairable memories 201~203. However, the processor takes longer time for testing and analyzing the memories and takes up more chip space when compared with the circuit illustrated in FIG. 1.

As described above, an ideal BISR circuit is desired for a chip having a plurality of memories.

SUMMARY OF THE INVENTION

Accordingly, the present invention is directed to a built-in redundancy analyzer (BIRA) which can perform repair analysis to a plurality of memories of different structures and sizes.

The present invention is directed to a redundancy analysis method, wherein a flexible built-in self repair (BISR) mechanism is provided and the analysis time and chip space used are both reduced.

The present invention provides a BIRA built in a chip having a plurality of repairable memories. The BIRA includes a parameter switch unit, an input conversion unit, and an analysis conversion unit. The parameter switch unit generates an identification code of a repairable memory containing a fault (referred as fault memory thereinafter) according to a memory fault signal and provides a parameter according to the identification code, wherein the parameter includes the length of column address, the length of row address, the length of word, the number of redundancy columns, and the number of redundancy rows of the fault memory. The input conversion unit is coupled to the parameter switch unit for receiving the parameter, and the input conversion unit converts the fault location received from a built-in tester from the format of the fault memory into a general format used in the BIRA according to the parameter. The analysis conversion unit is coupled to the parameter switch unit for receiving the parameter and to the input conversion unit for receiving the converted fault location. The analysis conversion unit performs a redundancy repair analysis according to the parameter and the fault location, converts an analysis result from the general format to the format of the fault memory, and then outputs the analysis result to the fault memory.

The present invention further provides a redundancy analysis method for a chip. The method includes following steps. First, an identification code of a fault memory is generated according to a memory fault signal, and a parameter is provided according to the identification code, wherein the parameter includes the length of column address, the length of row address, the length of word, the number of redundancy columns, and the number of redundancy rows of the fault memory. A fault location is then converted from the format of the fault memory into a general format according to the parameter. After that, a redundancy repair analysis is performed according to the parameter and the converted fault location. Eventually, an analysis result is converted from the general format to the format of the fault memory and is output to the fault memory.

According to the BIRA and the redundancy analysis method provided by the present invention, a fault location information output by a built-in tester is converted into a general format according to a parameter of a fault memory and is then analyzed, and an analysis result is then converted into the format of the fault memory according to the parameter and is output to the fault memory. Accordingly, a plurality of memories having different sizes and redundancy structures can be analyzed flexibly. Moreover, an optimal design of the BIRA in the present invention can be provided regarding a plurality of repairable memories, so that the analysis time and chip space used thereof can be both reduced.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 8A~8D are diagrams illustrating the operation of an analysis conversion unit in FIG. 4.

DESCRIPTION OF THE EMBODIMENTS

Figure 1:
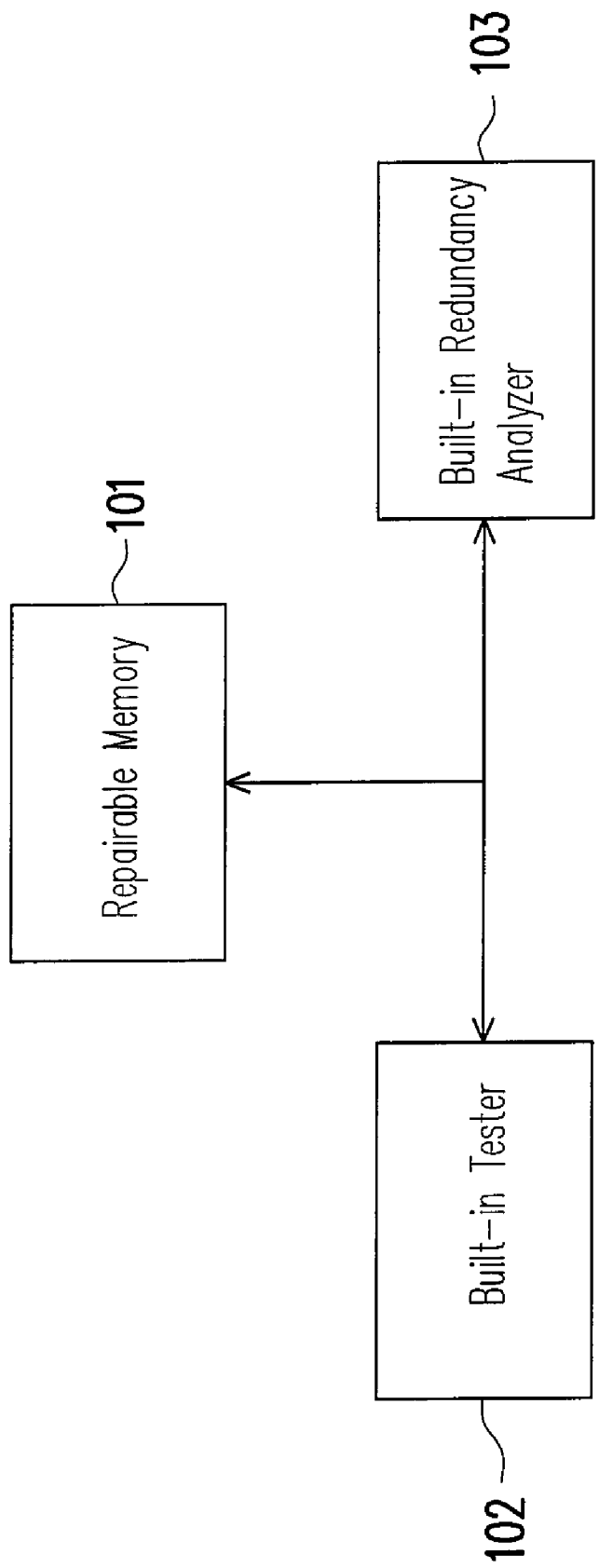
FIG. 1 is a diagram of a conventional built-in self repair (BISR) circuit.
Figure 2:
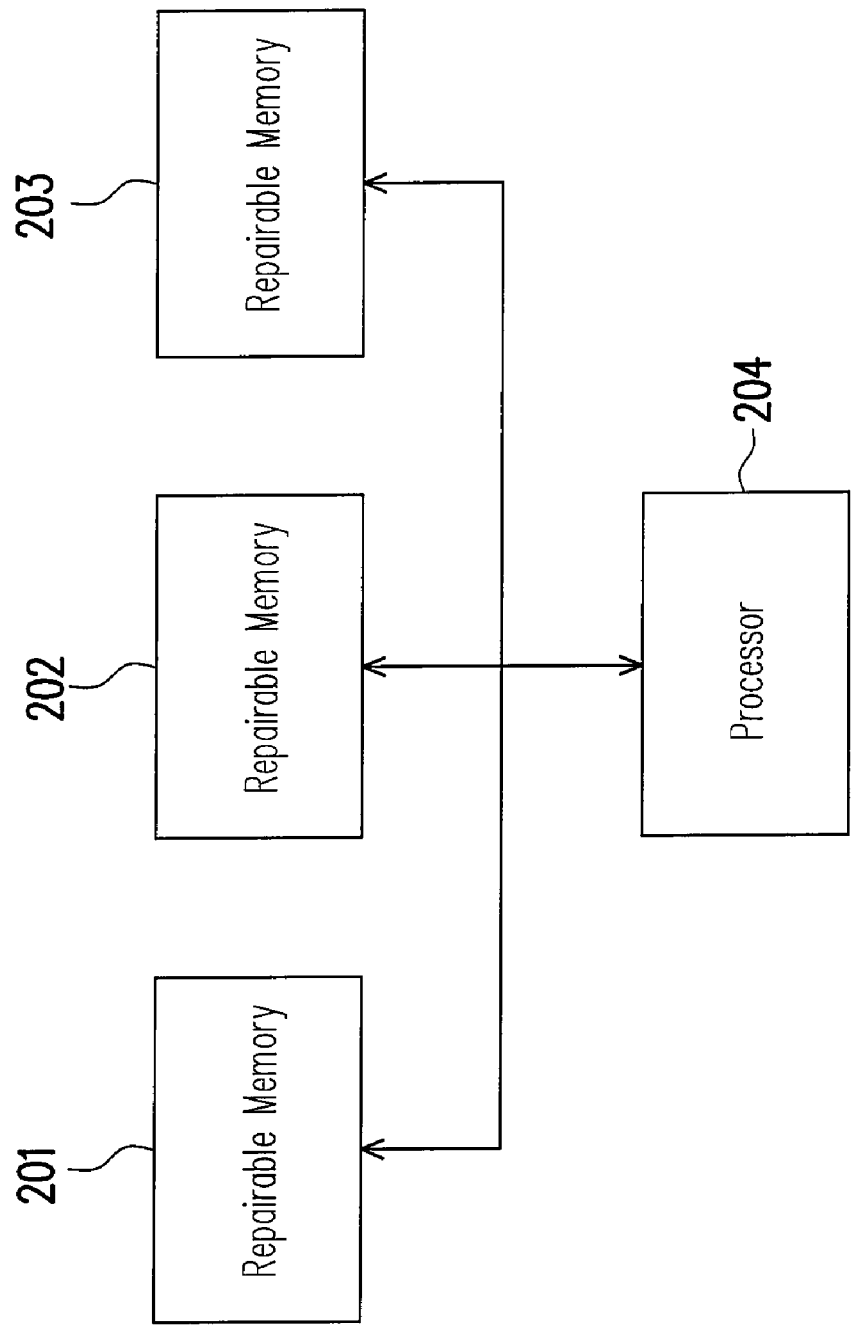
FIG. 2 is a diagram of another conventional BISR circuit.

Reference will now be made in detail to the present preferred embodiments of the invention, examples of which are illustrated in the accompanying drawings. Wherever possible, the same reference numbers are used in the drawings and the description to refer to the same or like parts.

Figure 3:
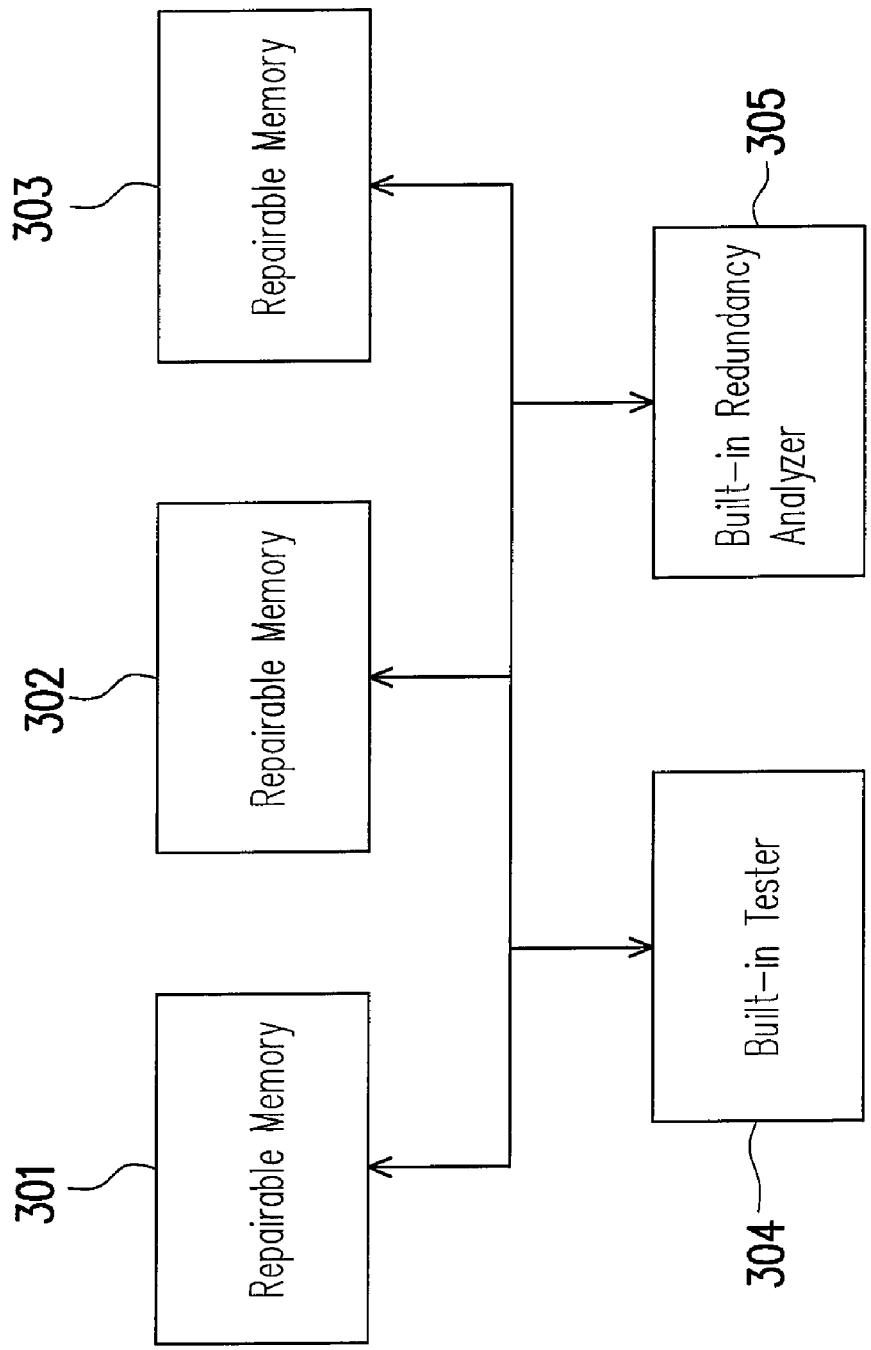
FIG. 3 is a diagram of a BISR circuit according to an embodiment of the present invention.

FIG. 3 is a diagram of a built-in self repair (BISR) circuit according to an embodiment of the present invention. Referring to FIG. 3, the BISR circuit is fabricated in a single chip and includes, demonstratively, three repairable memories 301~303. However, the BISR circuit may include any number of repairable memories according to the present invention. A built-in tester 304 tests the repairable memories 301~303 and notifies a fault to the built-in redundancy analyzer (BIRA) 305. The BIRA 305 performs a redundancy repair analysis according to a fault information received from the built-in tester 304 and then provides an analysis result to the repairable memory containing the fault (referred as fault memory thereinafter) so that the fault memory can repair the fault therein.

Figure 4:
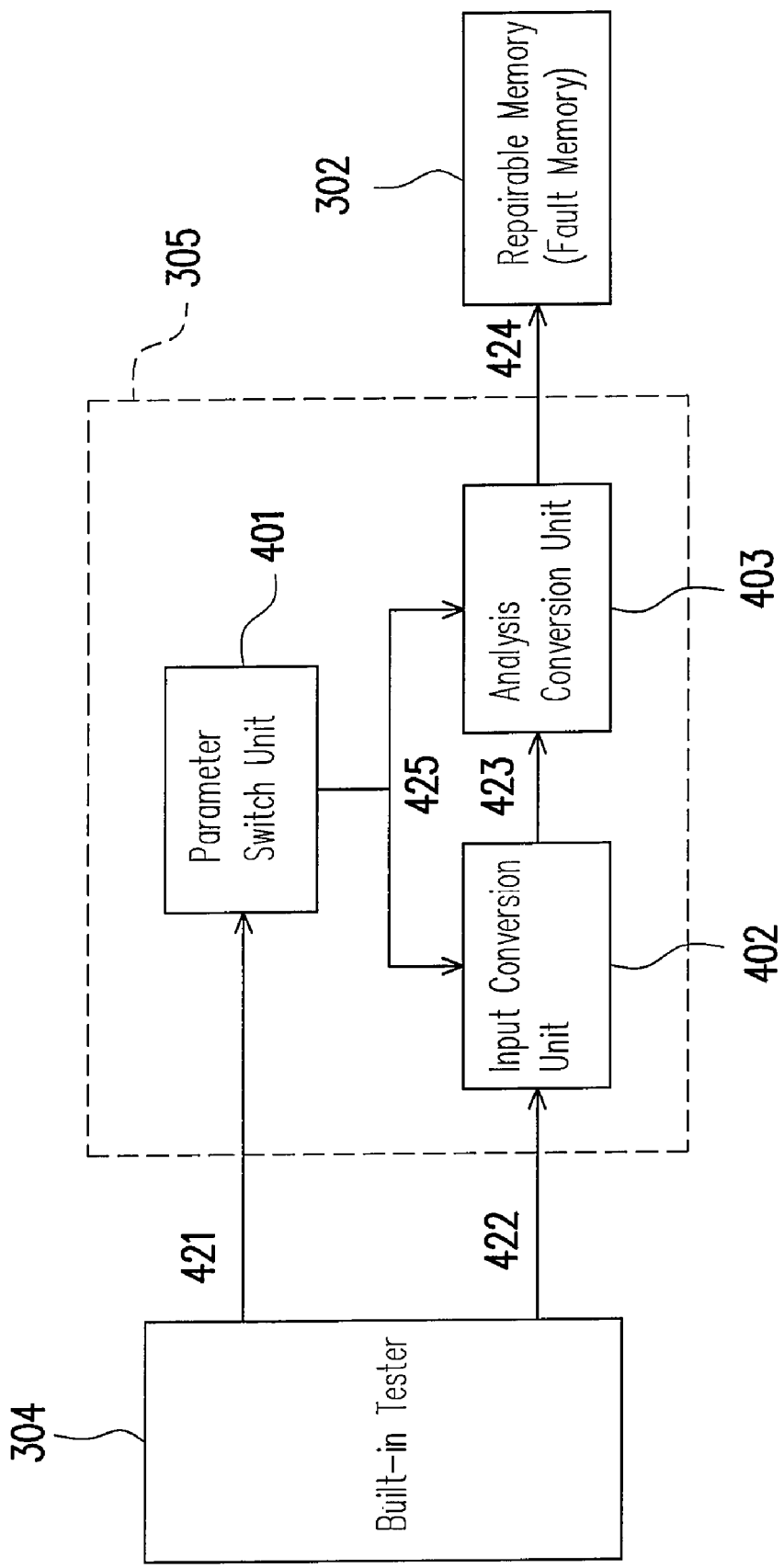
FIG. 4 is a block diagram of a built-in redundancy analyzer (BIRA) in FIG. 3.

FIG. 4 is a block diagram of a built-in redundancy analyzer (BIRA) in FIG. 3. Referring to FIG. 4, in the present embodiment, the BIRA 305 includes a parameter switch unit 401, an input conversion unit 402, and an analysis conversion unit 403. The fault information from the built-in tester 304 contains a memory fault signal 421 and a fault location 422. The memory fault signal 421 indicates which repairable memory encounters fault, and the fault location 422 indicates the location of the fault in the fault memory. Here it is assumed that the repairable memory 302 encounters a fault.

Since each repairable memory has different size and redundancy structure, the BIRA 305 has to adjust itself according to each repairable memory in order to support the repairable memory. Thus, the parameter switch unit 401 generates an identification code of the fault memory according to the memory fault signal 421 and provides a parameter 425 corresponding the fault memory according to the identification code, wherein the parameter 425 contains the length of column address, the length of row address, the length of word, the number of redundancy columns, and the number of redundancy rows of the fault memory. Next, the input conversion unit 402 converts the fault location 422 from the format of the fault memory 302 to a general format used in the BIRA 305 according to the parameter 425. After that, the analysis conversion unit 403 performs a repair analysis with the general format, then converts an analysis result 424 from the general format to the format of the fault memory 302 according to the parameter 425, and provides the analysis result 424 to the fault memory 302. As described above, the BIRA 305 can support multiple repairable memories of different sizes and structures by processing the other repairable memories in the same way.

Figure 5:
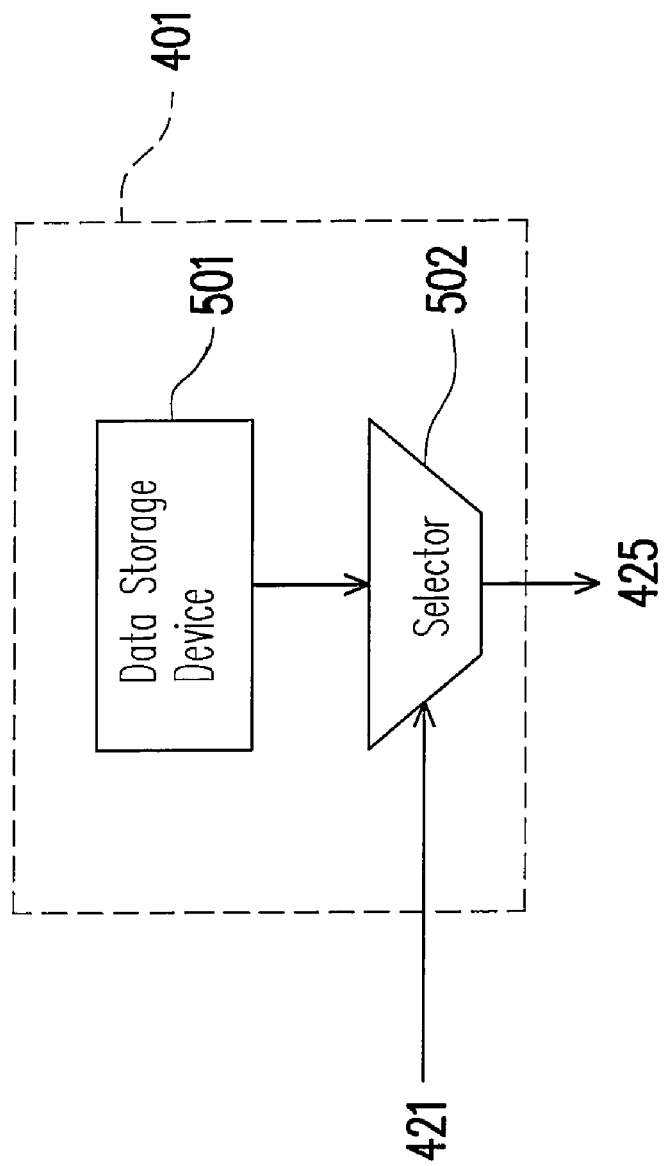
FIG. 5 is a block diagram of a parameter switch unit in FIG. 4.

FIG. 5 is a block diagram of the parameter switch unit 401 in FIG. 4. Referring to FIG. 5, the parameter switch unit 401 includes a data storage device 501 and a selector 502. The selector 502 is coupled between the input terminal and the output terminal of the parameter switch unit 401 and to the data storage device 501. The data storage device 501 stores a plurality of parameters, and each of the parameters is corresponding to one of the repairable memories in the chip. In the present embodiment, the memory fault signal 421 contains the identification code of the fault memory. The selector 502 reads the corresponding parameter 425 of the fault memory 302 from the data storage device 501 according to the identification code and then outputs the parameter 425.

Figure 6:
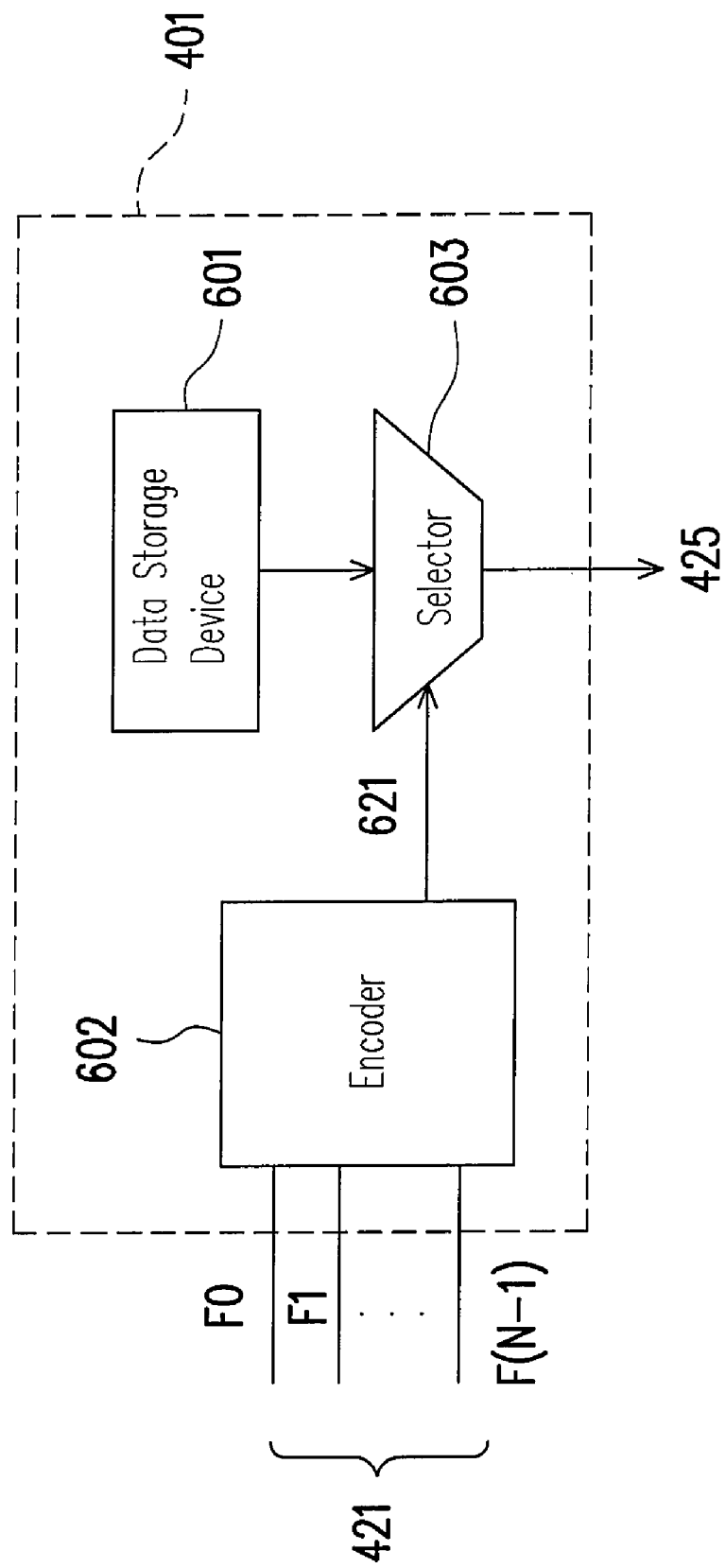
FIG. 6 is a block diagram of a parameter switch unit according to another embodiment of the present invention.

FIG. 6 is a block diagram of a parameter switch unit 401 according to another embodiment of the present invention. As shown in FIG. 6, the parameter switch unit 401 includes a data storage device 601, an encoder 602, and a selector 603. The encoder 602 is coupled to the input terminal of the parameter switch unit 401. The selector 603 is coupled to the output terminal of the parameter switch unit 401 and to the data storage device 601 and the encoder 602. In the present embodiment, the memory fault signal 421 contains a plurality of fault state signals F0, F1, . . . , F(N-1), wherein N is a positive integer. Each of the fault state signals is corresponding to one of the repairable memories in the chip and indicates the fault state of the corresponding repairable memory. For example, the logic state "1" of a particular fault state signal indicates that the corresponding repairable memory encounters a fault, and the logic state "0" thereof indicates that the corresponding repairable memory does not encounter any fault.

The encoder 602 generates the identification code 621 of the fault memory according to the fault state signals F0~F(N-1). With the three repairable memories (N=3) in FIG. 3 as example, if (F0, F1, F2)=(1, 0, 0), then the identification code is 0, which indicates that the repairable memory 301 encounters a fault; if (F0, F1, F2)=(0, 1, 0), then the identification code is 1, which indicates that the repairable memory 302 encounters a fault; and if (F0, F1, F2)=(0, 0, 1), then the identification code is 2, which indicates the repairable memory 303 encounters a fault. The data storage device 601 stores a plurality of parameters, wherein each of the parameters is corresponding to one of the repairable memories in the chip. The selector 603 reads the corresponding parameter 425 of the fault memory from the data storage device 601 according to the identification code 621 and outputs the parameter 425.

The input conversion unit 402 in FIG. 4 will be explained in detail. The input conversion unit 402 is coupled to the parameter switch unit 401 for receiving the parameter 425, and the input conversion unit 402 converts the fault location 422 from the format of the fault memory 302 to the general format of the BIRA 305 according to the parameter 425. In the present embodiment, the fault location 422 includes three portions which are respectively the column address of the fault (referred as fault column address thereinafter), the row address of the fault (referred as fault row address thereinafter), and fault bit indicator of the fault memory 302, wherein the fault bit indicator indicates the fault bit at foregoing addresses. In the present embodiment, the fault bit indicator is a Hamming syndrome. The length of each Hamming syndrome is the same as the word length of the fault memory 302, and the Hamming syndrome is corresponding to a word at foregoing fault column address and fault row address. If a particular bit of the Hamming syndrome is logic "1", it can be determined that the corresponding bit in the word encounters a fault.

Figure 7B:
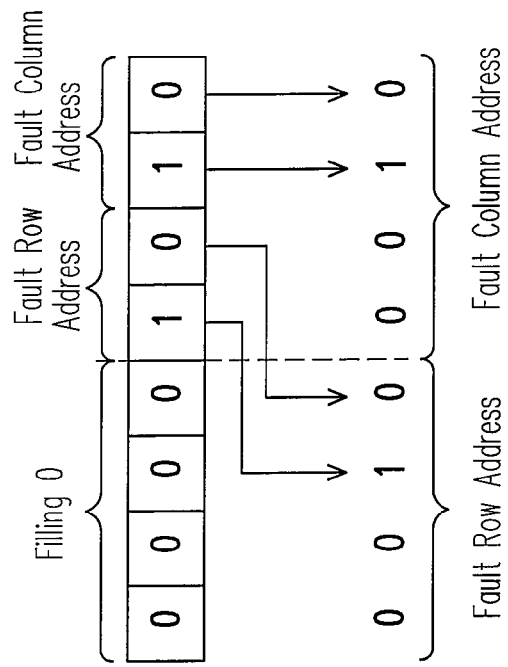
FIGS. 7A~7B are diagrams illustrating the operation of an input conversion unit in FIG. 4.
Figure 7A:
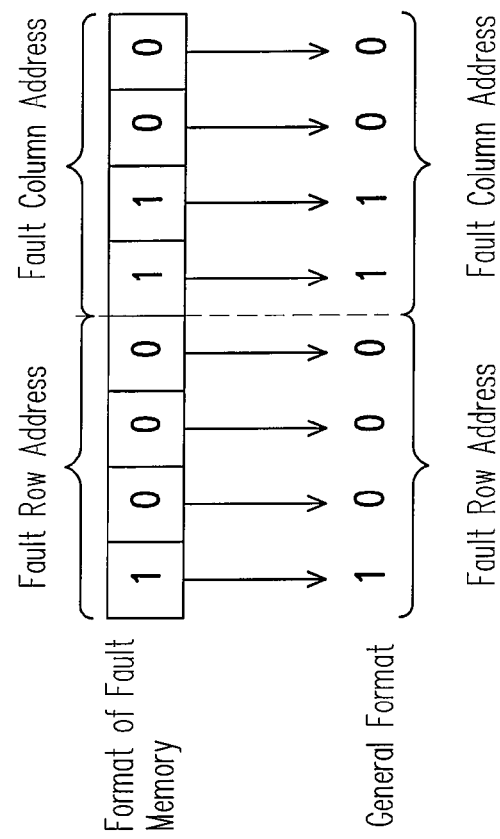

In the present embodiment, the format conversion refers to the conversion of the lengths of the three portions of the fault location 422. Namely, the input conversion unit 402 converts each portion of the fault location 422 from the length of that portion in the fault memory 302 to the length of that portion in the general format. FIGS. 7A~7B are diagrams illustrating the operation of an input conversion unit in FIG. 4. Referring to FIG. 7A, the lengths of row address and column address of the fault memory 302 are both 4-bit, and the lengths of fault row address and fault column address of the general form are also both 4-bit, therefore it is not necessary to convert the fault row address and fault column address provided by the built-in tester 304. On the other hand, referring to FIG. 7B, the lengths of row address and column address of the fault memory 302 are both 2-bit, while the lengths of fault row address and fault column address of the general format are both 4-bit, therefore the input conversion unit 402 has to convert the lengths of the fault row address and fault column address from 2-bit to 4-bit. The conversion of the fault bit indicator has similar pattern.

In order to perform redundancy analysis correctly and avoid any information loss, the length of each portion of the fault location 422 in the general format has to be greater than or equal to the length of this portion of each repairable memory. For example, the length of fault row address of the general format has to be greater than or equal to the lengths of the row addresses of the repairable memories 301~303, and so on. Accordingly, the general format can support repairable memories of different sizes.

The analysis conversion unit 403 in FIG. 4 will be described in detail. The analysis conversion unit 403 is coupled to the parameter switch unit 401 for receiving the parameter 425 and to the input conversion unit 402 for receiving the converted fault location 423. The analysis conversion unit 403 performs a redundancy repair analysis according to the parameter 425 and the fault location 423, converts an analysis result from the general format to the format of the fault memory 302, and then outputs the analysis result to the fault memory 302.

In the present embodiment, if the fault memory 302 has redundancy rows and the analysis result shows that redundancy rows are required for repair, the analysis result of the analysis conversion unit 403 contains at least one repair row address for notifying the fault memory 302 about which memory rows are to be repaired with the redundancy rows. Similarly, if the fault memory 302 has redundancy columns and the analysis result shows that redundancy columns are required for repair, the analysis result of the analysis conversion unit 403 contains at least one repair column address for notifying the fault memory 302 about which memory columns are to be repaired with the redundancy columns. The length of the repair row address is equal to the length of row address of the fault memory 302, and the length of the repair column address is equal to the length of column address of the fault memory 302. Since the number of redundancy elements of each repairable memory may be different, the lengths of the row address and the column address thereof may also be different. The fault memory 302 can only receive the analysis result correctly after the analysis conversion unit 403 converts the analysis result from the general format to the format of the fault memory 302.

In the present embodiment, the conversion of the analysis result mainly refers to the connection path combination of the analysis result, as shown in FIGS. 8A~8D. FIGS. 8A~8D are diagrams illustrating the operation of the analysis conversion unit 403 in FIG. 4. The analysis conversion unit 403 includes a plurality of conversion registers 800~802 for storing the repair column addresses and/or the repair row addresses of the analysis result. Each conversion register stores a repair column address or a repair row address. The analysis conversion unit 403 may obtain the length of column address, the length of row address, and the number of redundancy elements of the fault memory 302 from the parameter 425 and combines the connection paths of the analysis result according to foregoing information.

Referring to FIG. 8A, the analysis result contains three repair row addresses stored in the conversion registers 800~802, wherein the length of the repair row addresses is the same as that of the conversion registers. Here the connection path 821 contains the full length of the registers 800~802, and the analysis conversion unit outputs all the repair row addresses serially to the fault memory 302 in the order of the connection path 821.

Referring to FIG. 8B, the analysis result contains three repair row addresses stored in the conversion registers 800~802, wherein the length of the repair row addresses is only half of that of the conversion registers. Here the connection path 822 contains half of the length of the registers 800~802 storing the repair row addresses, and the analysis conversion unit outputs all the repair row addresses serially to the fault memory 302 in the order of the connection path 822.

Referring to FIG. 8C, the analysis result contains two repair row addresses stored in the conversion registers 801~802, wherein the length of the repair row addresses is the same as that of the conversion registers. Here the connection path 823 contains the full length of the conversion registers 801~802, and the analysis conversion unit outputs both the repair row addresses serially to the fault memory 302 in the order of the connection path 823.

Referring to FIG. 8D, the analysis result contains two repair row addresses stored in the conversion registers 801~802, wherein the length of the repair row addresses is only half of that of the conversion registers. Here the connection path 824 contains half of the length of the conversion registers 801~802 storing the repair row addresses, and the analysis conversion unit outputs both the repair row addresses serially to the fault memory 302 in the order of the connection path 824.

A general rule can be deduced from the operation of the analysis conversion unit 403 illustrated in FIGS. 8A~8D. Generally speaking, a connection path passes through all the conversion registers storing repair row addresses, and the number of these conversion registers is the same as the number of the repair row addresses, and the connection path only passes through the portion of each of the conversion registers wherein the repair row address is stored. In other words, the connection path does not pass through the portion of a conversion register wherein the length thereof exceeds that of the repair row address. The format conversion of the repair column addresses and the connection path thereof have similar patterns.

To contain the repair column addresses and repair row addresses of each repairable memory, the number of conversion registers has to be greater than or equal to the number of redundancy elements of each repairable memory. In addition, the length of each conversion register has to be greater than or equal to the length of column address of each repairable memory, and the length of each conversion register has also to be greater than or equal to the length of row address of each repairable memory.

On the other hand, the analysis conversion unit 403 directly issues an irreparable signal but does not provide any analysis result if a large number of faults are detected in the fault memory 302 and the number of faults exceeds the number of the redundancy columns or redundancy rows.

Besides the BIRA described above, the present invention also provides a redundancy analysis method. The method has been implemented by the BIRA in foregoing embodiments therefore the technical details thereof will not be described herein.

In overview, according to the present invention, the BIRA and the redundancy analysis method can self-adjust according to different parameters corresponding to different memories. Thus, the BIRA and the redundancy analysis method in the present invention can be used for analyzing multiple repairable memories of different sizes and redundancy structures flexibly. Moreover, an optimal design of the present invention can be adopted regarding a plurality of repairable memories, therefore the analysis time and chip space used can be both reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A built-in redundancy analyzer (BIRA), built in a chip comprising a plurality of repairable memories, the BIRA comprising:

a parameter switch unit, generating an identification code of a fault memory among the repairable memories according to a memory fault signal, and providing a parameter according to the identification code, wherein the parameter comprises a bit number of column address, a bit number of row address, a bit number of word, a number of redundancy columns, and a number of redundancy rows of the fault memory;

an input conversion unit, coupled to the parameter switch unit for receiving the parameter, converting a fault location from a first format of the fault memory into a second format used in the BIRA according to the parameter, wherein the first and the second formats have different bit numbers; and an analysis conversion unit, coupled to the parameter switch unit for receiving the parameter and coupled to the input conversion unit for receiving the converted fault location, the analysis conversion unit performing a redundancy repair analysis according to the parameter and the fault location, converting an analysis result from the second format to the first format, and outputting the analysis result to the fault memory.

2. The BIRA according to claim 1, wherein the memory fault signal comprises the identification code, and the parameter switch unit comprises:

a data storage device, storing a plurality of parameters, wherein each of the parameters is corresponding to one of the repairable memories; and a selector, coupled between an input terminal and an output terminal of the parameter switch unit and coupled to the data storage device, the selector reading the parameter corresponding to the fault memory from the data storage device according to the identification code and outputting the parameter.

3. The BIRA according to claim 1, wherein the memory fault signal comprises a plurality of fault state signals, and each of the fault state signals is corresponding to one of the repairable memories and indicates the fault state of the corresponding repairable memory, and the parameter switch unit comprises:

a data storage device, storing a plurality of parameters, wherein each of the parameters is corresponding to one of the repairable memories;

an encoder, coupled to the input terminal of the parameter switch unit, generating the identification code according to the fault state signals; and a selector, coupled to the output terminal of the parameter switch unit and coupled to the data storage device and the encoder, the selector reading the parameter corresponding to the fault memory from the data storage device according to the identification code and outputting the parameter.

4. The BIRA according to claim 1, wherein the fault location comprises three portions which are respectively a fault column address, a fault row address, and a fault bit indicator.

5. The BIRA according to claim 4, wherein regarding to each portion of the fault location, the bit number of the portion in the second format is greater than or equal to the bit number of the portion in each of the repairable memories.

6. The BIRA according to claim 5, wherein the input conversion unit converts each portion of the fault location so that each of the portions conforms to the bit number of each of portions in the second format.

7. The BIRA according to claim 1, wherein the analysis result of the analysis conversion unit comprises at least one of the following: at least one repair column address, at least one repair row address, and an irreparable signal; and the analysis conversion unit comprises at least one conversion register for storing the repair column addresses and/or the repair row addresses.

8. The BIRA according to claim 7, wherein the number of the conversion registers is greater than or equal to the number of redundancy elements of each of the repairable memories, the redundancy elements comprise redundancy columns and redundancy rows, and the bit number of each of the conversion registers is greater than or equal to the maximum bit number of column address and row address of each of the repairable memories.

9. The BIRA according to claim 8, wherein the analysis conversion unit outputs the repair column addresses stored in the conversion registers serially to the fault memory according to the number of redundancy columns and the bit number of column address of the fault memory.

10. The BIRA according to claim 8, wherein the analysis conversion unit outputs the repair row addresses stored in the conversion registers serially to the fault memory according to the number of redundancy rows and the bit number of row address of the fault memory.

11. A redundancy analysis method, suitable for a chip comprising a plurality of repairable memories, the redundancy analysis method comprising:

(a) generating an identification code of a fault memory among the repairable memories according to a memory fault signal, and providing a parameter according to the identification code, wherein the parameter comprises a bit number of column address, a bit number of row address, a bit number of word, a number of redundancy columns, and a number of redundancy rows of the fault memory;

(b) converting a fault location from a first format of the fault memory to a second format according to the parameter, wherein the first and the second formats have different bit numbers;

(c) performing a redundancy repair analysis according to the parameter and the converted fault location; and (d) converting an analysis result from the second format to the first format, and outputting the analysis result to the fault memory.

12. The redundancy analysis method according to claim 11, wherein the memory fault signal comprises the identification code, and step (a) comprises:
- providing a plurality of parameters, wherein each of the parameters is corresponding to one of the repairable memories; and
- selecting the parameter corresponding to the fault memory from the parameters according to the identification code and outputting the selected parameter.

13. The redundancy analysis method according to claim 11, wherein the memory fault signal comprises a plurality of fault state signals, and each of the fault state signals is corresponding to one of the repairable memories and indicates the fault state of the corresponding repairable memory, and step (a) comprises:
- providing a plurality of parameters, wherein each of the parameters is corresponding to one of the repairable memories;
- generating the identification code according to the fault state signals; and
- selecting the parameter corresponding to the fault memory from the parameters according to the identification code and outputting the selected parameter.

14. The redundancy analysis method according to claim 11, wherein the fault location comprises three portions which are respectively a fault column address, a fault row address, and a fault bit indicator.

15. The redundancy analysis method according to claim 14, wherein regarding to each portion of the fault location, the bit number of the portion in the second format is greater than or equal to the bit number of the portion in each of the repairable memories.

16. The redundancy analysis method according to claim 15, wherein step (b) comprises:
- converting each said portion of the fault location so that each said portion conforms to the bit number of each said portion in the second format.

17. The redundancy analysis method according to claim 11, wherein the analysis result comprises at least one of the following: at least one repair column address, at least one repair row address, and an irreparable signal.

18. The redundancy analysis method according to claim 17, wherein step (d) comprises:
- outputting the repair column addresses serially to the fault memory according to the number of redundancy columns and the bit number of column address of the fault memory.

19. The redundancy analysis method according to claim 17, wherein step (d) comprises:
- outputting the repair row addresses serially to the fault memory according to the number of redundancy rows and the bit number of row address of the fault memory.

* * * * *